United States Patent
Yumshtyk

(10) Patent No.: US 9,368,330 B2
(45) Date of Patent: Jun. 14, 2016

(54) SPUTTERING TARGETS AND METHODS

(71) Applicant: BH5773 LTD, Hollywood, FL (US)

(72) Inventor: Gennady Yumshtyk, Hollywood, FL (US)

(73) Assignee: BH5773 LTD, Hollywood, FL (US)

( * ) Notice: Subject to any disclaimer, the term of this patent is extended or adjusted under 35 U.S.C. 154(b) by 81 days.

(21) Appl. No.: 14/268,212

(22) Filed: May 2, 2014

(65) Prior Publication Data

US 2015/0318152 A1    Nov. 5, 2015

(51) Int. Cl.
*C23C 14/35* (2006.01)
*H01J 37/34* (2006.01)

(52) U.S. Cl.
CPC .............. *H01J 37/3423* (2013.01); *C23C 14/35* (2013.01)

(58) Field of Classification Search
CPC . C23C 14/35; C23C 14/3407; H01J 37/3414; H01J 37/342; H01J 37/3423; H01J 37/3426; H01J 37/3429; H01J 37/345
USPC .............. 204/192.12, 298.12, 298.21, 298.22
See application file for complete search history.

(56) References Cited

U.S. PATENT DOCUMENTS

| | | | |
|---|---|---|---|
| 3,477,935 A | 11/1969 | Hall | |
| 3,716,472 A | 2/1973 | Kausche | |
| 3,976,031 A | 8/1976 | Itoh | |
| 4,031,424 A | 6/1977 | Penfold et al. | |
| 4,179,351 A | 12/1979 | Hawton, Jr. et al. | |
| 4,221,652 A | 9/1980 | Kuriyama | |
| 4,356,073 A | 10/1982 | McKelvey | |
| 4,374,722 A | 2/1983 | Zega | |
| 4,376,025 A | 3/1983 | Zega | |
| 4,407,713 A * | 10/1983 | Zega | H01J 37/3405 204/192.12 |
| 4,418,645 A | 12/1983 | Knights | |
| 4,422,916 A | 12/1983 | McKelvey | |
| 4,443,318 A | 4/1984 | McKelvey | |
| 4,478,703 A * | 10/1984 | Edamura | H01J 37/3405 204/192.12 |
| 4,500,409 A | 2/1985 | Boys et al. | |
| 4,505,798 A | 3/1985 | Ramachandran et al. | |
| 4,610,774 A | 9/1986 | Sakata et al. | |
| 4,622,121 A | 11/1986 | Wegmann et al. | |
| 4,824,540 A | 4/1989 | Stuart | |
| 4,904,362 A | 2/1990 | Gaertner et al. | |
| 4,957,605 A | 9/1990 | Hurwitt et al. | |
| 5,174,875 A | 12/1992 | Hurwitt et al. | |
| 5,190,630 A | 3/1993 | Kikuchi et al. | |

(Continued)

FOREIGN PATENT DOCUMENTS

| | | |
|---|---|---|
| JP | 52-095581 | 8/1977 |
| JP | 55-027627 | 2/1980 |

(Continued)

OTHER PUBLICATIONS

US 4,301,424, 6/1977, Penfold et al. (withdrawn).

(Continued)

*Primary Examiner* — Rodney McDonald
(74) *Attorney, Agent, or Firm* — Lathrop & Gage LLP

(57) ABSTRACT

Multi-component sputtering target structures suitable for deposition of metallic alloy films are provided. The multi-component target may be formed by winding wires of different materials around a target support structure to form a dense winding. The sputtering target structures and methods of the invention can be used to produce a variety of refractory metal alloy films.

18 Claims, 6 Drawing Sheets

(56) References Cited

U.S. PATENT DOCUMENTS

| | | |
|---|---|---|
| 5,317,006 A | 5/1994 | Kumar |
| 5,417,833 A | 5/1995 | Harra et al. |
| 5,466,355 A | 11/1995 | Ohhashi et al. |
| 5,518,597 A | 5/1996 | Storer et al. |
| 6,193,853 B1 | 2/2001 | Yumshtyk et al. |
| 6,365,011 B1 | 4/2002 | Yumshtyk |
| 6,436,252 B1 | 8/2002 | Tzatzov et al. |
| 6,464,844 B1 | 10/2002 | Pichulo et al. |
| 6,692,618 B2 | 2/2004 | Dubs |
| 6,692,619 B1 | 2/2004 | Chen et al. |
| 6,709,557 B1 | 3/2004 | Kailasam et al. |
| 6,767,436 B2 | 7/2004 | Wei |
| 7,563,488 B2 * | 7/2009 | De Bosscher ............ C23C 2/26 148/559 |
| 8,741,115 B2 | 6/2014 | Yumshtyk et al. |
| 2003/0085114 A1 | 5/2003 | Johnson et al. |
| 2004/0206620 A1 | 10/2004 | Wang et al. |
| 2006/0207871 A1 | 9/2006 | Yumshtyk et al. |
| 2009/0145743 A1 | 6/2009 | Yumshtyk et al. |
| 2009/0205955 A1 * | 8/2009 | De Smet ............ C23C 14/3414 204/298.12 |
| 2011/0240467 A1 | 10/2011 | Itoh et al. |
| 2013/0228451 A1 | 9/2013 | Maass et al. |
| 2014/0262750 A1 | 9/2014 | Yumshtyk et al. |

FOREIGN PATENT DOCUMENTS

| | | | |
|---|---|---|---|
| JP | 55-069256 | | 5/1980 |
| JP | 01-212759 | * | 8/1989 |
| JP | 09-115733 | | 5/1997 |
| WO | WO 2006/091943 | | 8/2006 |

OTHER PUBLICATIONS

Thornton et al. (1978) "Cylindrical Magnetron Sputtering," In; *Thin Film Processes*, Academic Press Inc., pp. 75-113.

* cited by examiner

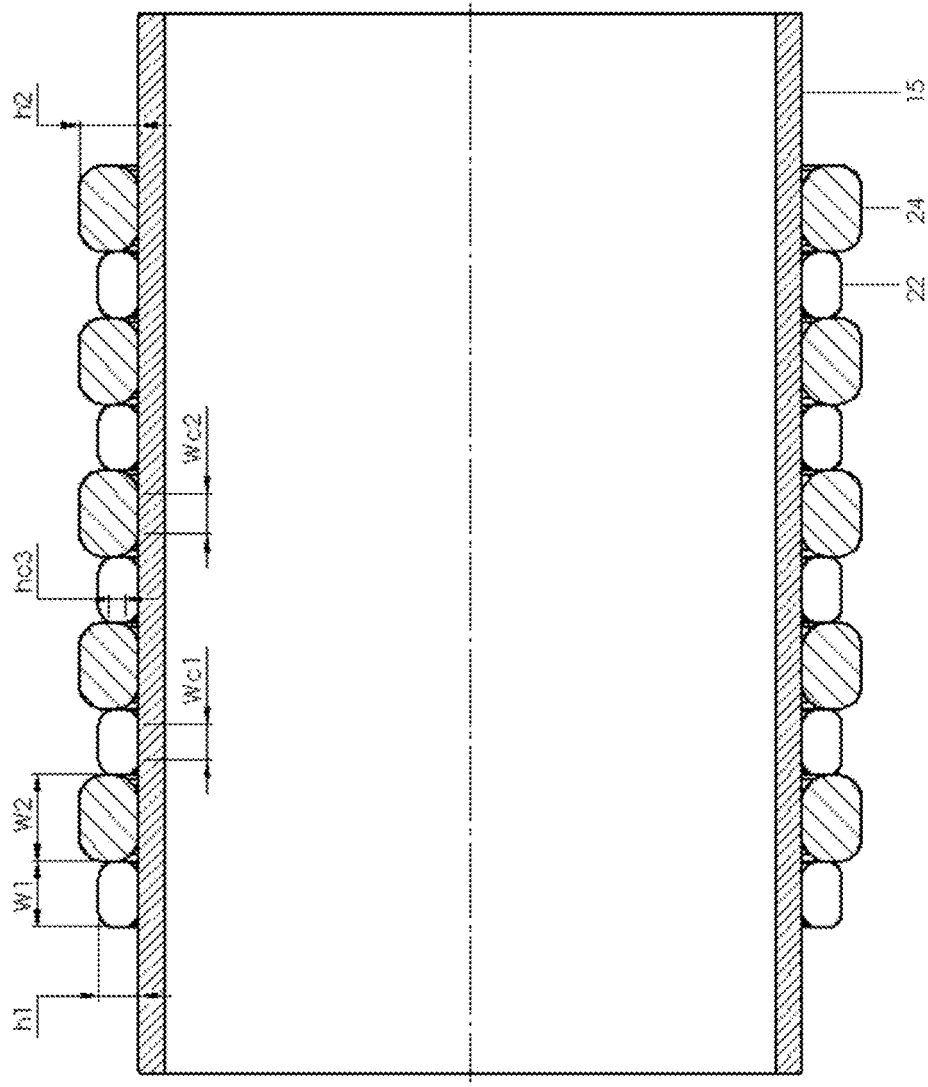

SPUTTERING TARGETS AND METHODS

BACKGROUND

The present invention relates to methods and devices for applying coatings by cylindrical magnetron sputtering, in particular devices and methods where a magnetic field is created by one or more magnets.

Magnetron sputtering processes are classified as planar or cylindrical. A target provides the material to be sputtered. Several different types of cylindrical magnetron sputtering devices have been developed, as disclosed and summarized by Thornton et al., "Cylindrical Magnetron Sputtering", 1978 Academic Press, Inc., pp. 75-113. Cylindrical magnetron sputtering devices are used to coat cylindrical workpieces, such as the inside surfaces of pipes.

The target used with planar magnetron sputtering devices can be circular, rectangular or triangular in shape. Planar magnetron sputtering targets generally suffer from non-uniform erosion, with the area of maximum erosion in the shape of a racetrack centered around the magnet position, rendering the target unusable after use, even while relatively large amounts of useful target material still remain. Basically, the target material in a cylindrical magnetron sputtering device is in the form of an elongated tube A variety of target configurations have been described for sputtering several materials simultaneously. U.S. Pat. No. 3,477,935 describes formation of a film comprising nickel, chromium and silicon by sputtering a target body comprising a silicon body wound about with wires comprising nickel and chromium alloy; the amount of silicon in the deposited compound is described as depending on the amount and spacing of the wire on the target body, i.e. the amount of silicon surface available for sputtering. U.S. Pat. No. 4,610,774 describes a sputtering target structure suitable for use with a planar magnetron sputtering device. The sputtering target structure has a plurality of annular target members arranged concentrically with respect to a rotational symmetry axis; the target structure may have a projecting annular target member. US Patent Publication US 2004/0206620 described a rotating sputtering target segmented so as to include a plurality of different sputtering portions or segments radially dispersed around the outer periphery of the target to be sputtered to deposit a multi-layer coating; the overall shape of the sputtering target may be cylindrical.

BRIEF SUMMARY

The sputtering target structures and methods of the invention can be used to produce sputtered alloy films on a workpiece via cylindrical magnetron sputtering; some desirable alloy film compositions may be problematic to produce using other processing techniques. For example, the sputtering target structures and methods of the invention can be used to provide a variety of refractory metal alloy films. In this invention, alloy films are produced through simultaneous sputtering of at least two different materials, the at least two different materials being provided by the sputtering target structures of the invention.

The sputtering target structures of the invention include at least two components, with at least two of the components being of different materials. In an embodiment, each of the materials is a metal or metal alloy. In an embodiment, at least one of the materials comprises a refractory metal. In another embodiment, the material is selected from the group consisting of Al, Ta, W, Cr, Mo, Ti, Nb, Hf, Zr, Co, Re, Ni, Si and alloys thereof.

In an aspect, the sputtering target structure is in an elongated form and components of the sputtering target structure are configured so that the different materials alternate along the length of the structure. In an embodiment, the invention provides a sputtering target structure comprising a tubular target support; and a multi-component target at least partially covering the outer surface of the target support. In an embodiment, each of the components of the target may be in the form of a coiled wire. The coils are overlapping or interlocked so that adjacent loops of the coils contact each other, as illustrated in FIG. 1. As schematically illustrated in FIG. 1, the sputtering target structure 10 is generally cylindrical. The multi-component target 20 comprises a first component 22 of a first material, the first component being coiled around the target support 15 and a second component 24 of a second material, the second component also being coiled around the target support. The coils of the first and the second component are interlocking or interlaced. FIG. 1 illustrates two coils interlocked so that loops of the first coil alternate with loops of the second coil. Contact between the components of the target limits sputtering of the underlying target support. The first and second coils are also in contact with the target support. In other embodiments, the multi-component target may comprise additional components. For example, the multi-component target may comprise a third coiled component which is interlocking or interlaced with the coils of the first and the second components.

As shown in FIG. 1, the two coils contact each other so as to shield the target support from the plasma. One or more inter-component contact regions are formed between the outer surfaces of the components of the sputtering target structure. Contact regions are also formed between the outer surfaces of the components of the sputtering target structure and the outer surface of the target support, as explained with reference to FIG. 2A below.

FIG. 2A schematically illustrates a cross-sectional view of a sputtering target in which the two components (22, 24) are wound around the target support (15). The longitudinal axis of the sputtering target is shown with a broken line. For convenience, the two components in FIG. 2A are shown as having the same width and height. However, in other embodiments, the components may differ in width and/or height. The cross-sectional shape of each of the components may be circular or other than circular. If a component is circular in cross-section, the width and the height are equal to each other and the component may be described by its diameter. In an embodiment, each of the components has a cross-section which is more rectangular than circular, as illustrated in FIG. 2A. In FIG. 2A, the widths of the two components are shown as essentially equal and the heights of the two components are also shown as essentially equal. In FIG. 2A, the width of the two components in the plane of the cross-section is shown as $W_1$ and $W_2$, respectively. The height of the two components in the plane of the cross-section is shown as $h_1$ and $h_2$, respectively.

The first, second and third contact regions are also shown in FIG. 2A. The width of the first contact region formed between the first component and the outer surface of the target support is shown in FIG. 2A as $W_{c1}$. The width of the second contact region formed between the second component and the outer surface of the target support is shown in FIG. 2A as $W_{c2}$. The height of the third contact region formed between the outer surfaces of the first and second components is shown in FIG. 2A as $h_{c3}$. The width or height of a given contact region may vary along the component(s) due to variation in cross-sectional shape along the component. The width of a given contact region may be referenced to the average, maximum or minimum width of one or more components. The height of a given contact region may be referenced to the average, maximum or minimum height of one or more components. The maximum height of the first component may be referred to the first maximum height; the maximum height of the second component may be referred to as the second maximum height and so forth. The maximum width of the first component is referred to the first maximum width; the maximum width of the second component is referred to as the second maximum width and so forth.

In different embodiments, the width of the first contact region is not less than 2% the average width of the first component, from 2% to 95% of the average width of the first component, from 10% to 95% of the average width of the first component, from 25% to 95 of the average width of the first component, from 50% to 90% of the average width of the first component or from 50% to 75% of the average width of the first component. In different embodiments, the width of the second contact region is not less than 2% of the average width of the second component, from 2% to 95% of the average width of the second component, from 10% to 95% of the average width of the second component, from 25% to 95% of the average width of the second component, from 50% to 90% of the average width of the second component or from 50% to 75% of the average width of the second component. In different embodiments, the height of the third contact region is, from 2% to 100% of the smaller of the maximum height of the first component and the maximum height of the second component, from 10% to 95% of the smaller of the maximum height of the first component and the maximum height of the second component, from 25% to 95% of the smaller of the maximum height of the first component and the maximum height of the second component, from 50% to 90% of the smaller of the maximum height of the first component and the maximum height of the second component or from 50% to 75% of the smaller of the maximum height of the first component and the maximum height of the second component.

FIG. 2B illustrates an embodiment of the invention where the height (h1) of the first component (22) is less than that (h2) of the second component (24). The width W1 is also less than the width W2. In different embodiments, the ratio of the first maximum height to the second maximum height is from 0.3 to 3 or from 0.5 to 2. In different embodiments, the ratio of the first maximum width to the second maximum width is from 0.3 to 3 or from 0.5 to 2.

FIG. 2C illustrates an embodiment of the invention where three components (22, 24, 26) are present. As illustrated in the figure, the three components have similar widths and heights in the plane of the cross-section.

In another aspect, the invention provides methods for sputtering a film onto a workpiece using the inventive multi-component sputtering targets. The configuration of the sputtering target structures of the invention is compatible with cylindrical magnetron sputtering techniques, allowing sputter coating of the inside of hollow elongate structures. In an embodiment, the elongate structures may be cylindrical. In another embodiment, the elongate structures are not cylindrical but are symmetric about their longitudinal axis.

Adjustment of the relative dimensions of the components (e.g. width and height) can allow adjustment of the amounts of the materials being sputtered and thus the alloy composition in the film to be deposited. The composition of the film can also be adjusted by using more than two components, with at least two of the components comprising the same material. Such a target would be produced by the target illustrated in FIG. 2C when two of the components (e.g. 22, 26) comprise the same material.

In an embodiment, the invention provides a method for applying a sputtered coating onto the interior surface of a hollow elongate workpiece, the method comprising the steps of:
a) positioning a sputtering target structure within the workpiece so that the longitudinal axis of the sputtering target structure is parallel to the longitudinal axis of the workpiece and positioning a magnet assembly within the inner bore of the sputtering target structure or outside the workpiece;
b) providing a low pressure environment comprising a sputtering gas exterior to the sputtering target structure and interior to the workpiece;
c) creating a plasma field between the sputtering target structure and the workpiece, thereby generating sputtering gas ions; and
d) using the magnet assembly to create a magnetic field exterior to the sputtering target structure.

In another embodiment, the invention provides a method for applying a sputtered coating onto the exterior surface of a hollow elongate workpiece, the method comprising the steps of:
a) positioning a sputtering target structure so that the longitudinal axis of the sputtering target structure is parallel to the longitudinal axis of the workpiece and positioning a magnet assembly within the inner bore of the sputtering target structure or outside the workpiece;
b) providing a low pressure environment containing a sputtering gas exterior to the sputtering target structure and exterior to the workpiece;
c) rotating the workpiece around its longitudinal axis;
d) creating a plasma field between the sputtering target structure and the workpiece, thereby generating sputtering gas ions; and
e) using the magnet assembly to create a magnetic field exterior to the sputtering target structure.

In another embodiment, the invention provides a method for simultaneously coating the interior and exterior surfaces of a workpiece. The coating applied to the internal workpiece surface can be different in composition and/or thickness than that applied to the external surface of the workpiece. The sputtering target structure used to coat the exterior surface of the workpiece is placed external to the workpiece, with its longitudinal axis parallel to longitudinal axis of the workpiece. The sputtering target structure used to coat the interior surface of the workpiece is placed inside the workpiece, with its longitudinal axis coincident with that of the workpiece. A plasma field is created between the external emitter and the workpiece and between the internal emitter and the workpiece. In addition, a magnetic field is created around each emitter as previously described. The workpiece is rotated to more evenly apply the coating.

The interior and exterior surfaces of a plurality of workpieces can be coated by providing a central emitter assembly which is exterior to each of the workpieces and an emitter assembly inside each of the workpieces. A plasma field is created between the external emitter assembly and each workpiece and between each internal emitter assembly and workpiece. A magnetic field is created around each emitter using one or more magnets.

BRIEF DESCRIPTION OF THE DRAWINGS

FIG. 2B is a schematic cross-section view of a sputtering target structure for which the two components have different average heights or widths.

DETAILED DESCRIPTION

Figure 1:
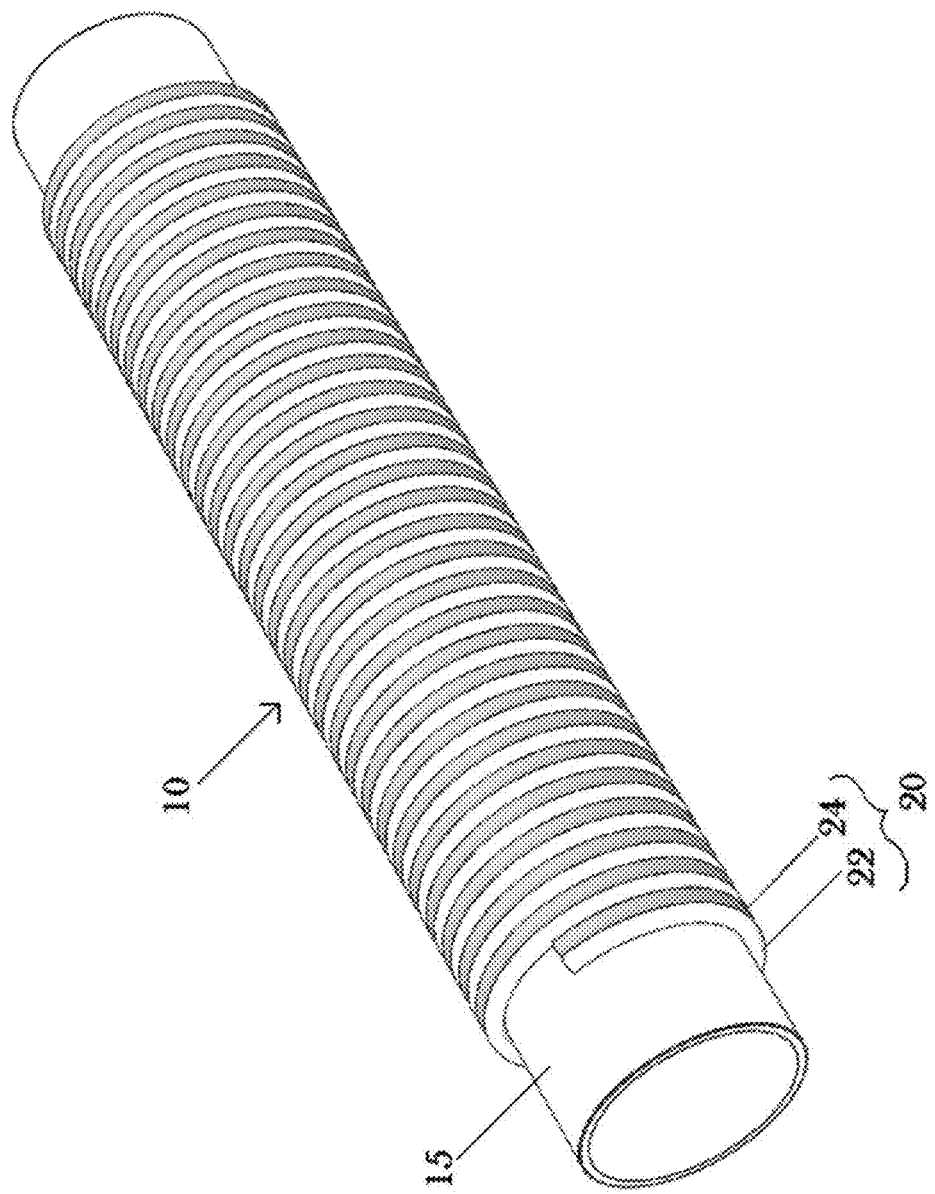
FIG. 1 is a schematic perspective view of a sputtering target structure with two coiled components, each component being of a different material.
Figure 2A:
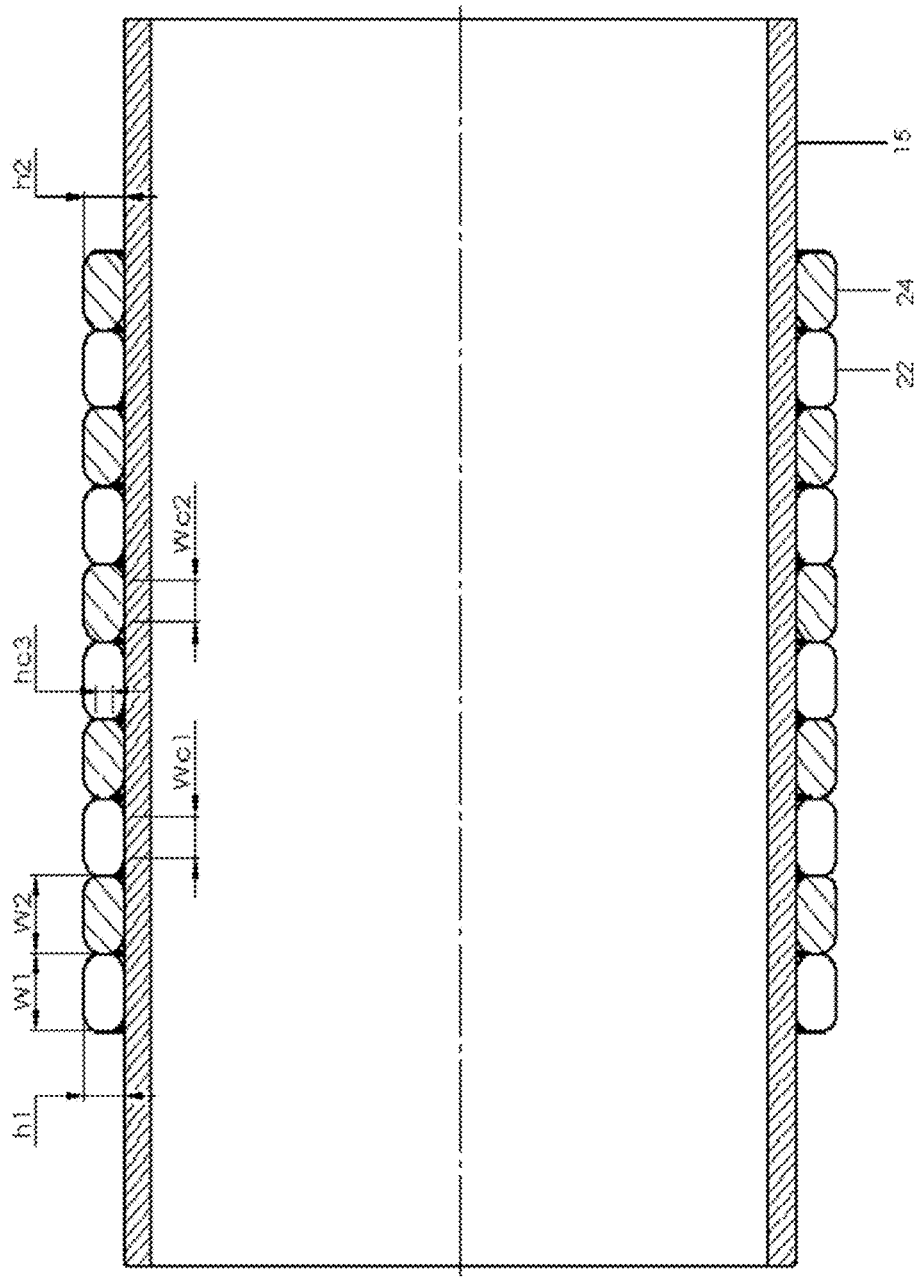
FIG. 2A is a schematic cross-section view of a sputtering target structure for which the two components have similar average heights and widths.
Figure 2C:
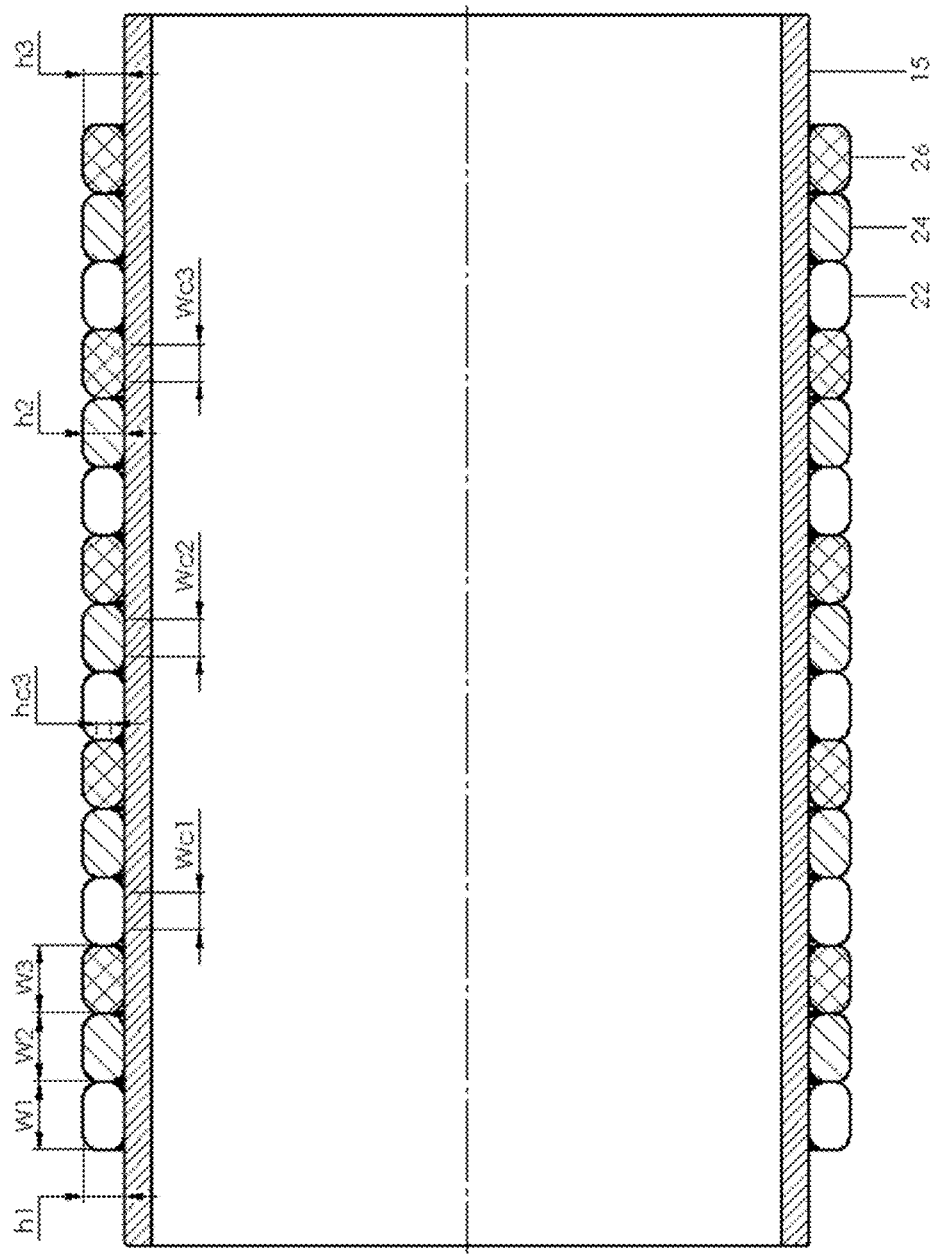
FIG. 2C is a schematic cross-section view of a sputtering target structure in which in which there are three coils, the first, second and third component comprising different materials.

In the following description of the drawings, like reference numerals indicate like elements.

The sputtering target structures and methods of the invention can be used to produce sputtered films comprising a plurality of chemical elements. The sputtered film may comprise an alloy in which two or more elements are intimately mixed, with at least one of the elements being a metal. In an embodiment, the sputtered film is a metallic alloy film.

The sputtering target structure comprises a multi-component target, the multi-component target comprising a first component of a first material and a second component of a second material. The multi-component target may comprise further components, e.g. a third or third and fourth components. Preferred materials for use in the components of the invention are predominately metallic, but may comprise other elements and/or compounds present as second phases or impurities. In an embodiment, materials used in the components of the invention comprise 90%-100% of a metal or alloy. In an embodiment, at least one of the materials is selected from the group consisting of Al, Ta, W, Cr, Mo, Ti, Nb, Hf, Zr, Co, Re, Si and Ni and alloys thereof. In an embodiment, at least one of the materials is a refractory metal or alloy thereof. Refractory metals include Nb, No, Ta, W, Re, Ti, V, Cr, Zr, Ru, Rh, Hf, Os and Ir. Preferred combinations include, but are not limited to, Zr—Mo, Nb—Mo, Zr—Ta—W, Mo—Ta—Ti and Mo—Ta. For two materials, the relative amounts of the metals can be, 10-90%, 20-80%, 30-70%, 40-60% or 50-50% of each. If there are three materials, the relative amounts of the three materials can be 10-80%, 20-60%, 30-40% of each.

In an embodiment, the sputtered film comprises 10-90%, 20-80%, 30-70%, 40-60% or 50-50% of each metal when there are two metals or 10-90%, 20-80%, 30-70%, 40-60% or 50-50% of each metal when there are three metals. In an embodiment, the film compositions are in weight %. In an embodiment, the combined total of the metals is 100%, 98-100% or 95-100%. In an embodiment, any gas impurities and/or support components incorporated into the film are less than 1% of the film composition. These compositions can be average compositions measured over a cross-section of the film. A cross-section of the sputtered film can appear homogeneous when viewed with a scanning electron microscope at a magnification of 350-600×. In an embodiment, the thickness of the sputtered film may be from 5 to 2000 micrometers.

In an aspect, the sputtering target structure is elongate, having a greater length than width. In an embodiment, the sputtering target structure is characterized by a longitudinal axis. In an embodiment, the sputtering target structure is generally cylindrical in shape.

In an aspect, the target support structure is in the form of a tube. In an embodiment, the tube support structure is metallic to provide thermal conductivity. In some embodiments the inner diameter of the tube is selected to allow insertion of a magnet assembly.

The multi-component target may be formed by winding wires of different materials around the target support structure. In an embodiment, the wires do not include a polymeric insulating coating. Each component formed thereby is in the form of a coil or series of loops. In an embodiment, the number of coils or loops in each component is from 4 to 4 million or from 50 to 50000. In an embodiment, the wires are generally circular in cross-section. In another embodiment, wires of circular cross-section are reshaped so that a denser target is formed upon winding. In an embodiment, the wires are flattened so they approach a rectangular cross-section. In different embodiments, the diameter of the multi-component target is between about 0.5" and about 12", between about 0.1" and about 5", and between about 0.05" and about 2". In different embodiments, the wire diameter, height or width can be from 0.20 to 3 mm or from 0.5 to 1.5 mm. In an embodiment, at least a portion of the loops in each coil overlap or interlock. In different embodiments, coil overlap region is 80-100%, 90%-100% or, as illustrated in FIG. 1, essentially 100% of the length of the longest coil. In contrast, if the loops in a first coil do not overlap with the loops of a second coil, the loops of the first coil contact loops of the second coil only at the ends of the first coil.

In an embodiment, the sputtering target structure is employed as part of an emitter assembly. The emitter assembly comprises a magnet assembly capable of providing a magnetic field external to the emitter and in the vicinity of the external surface of the emitter. In an embodiment, the magnet assembly comprises a plurality of magnets. In an embodiment, the magnets are electromagnets. In an embodiment, the magnet assembly is placed within the inner bore of the sputtering target structure. In this embodiment a gap may be present between the magnet assembly and the interior surface of the sputtering target support. Such a gap eases longitudinal movement of the magnet assembly within the emitter and allows fluid cooling of the emitter assembly. In another embodiment, the magnet assembly may be located outside a vacuum chamber, while the sputtering target structure is placed inside the vacuum chamber. In some embodiments, the workpiece may serve as part of the vacuum chamber. In other embodiments the vacuum chamber is distinct from the workpiece.

In an embodiment, the magnet assembly comprises a plurality of magnet units. In an embodiment, each magnet unit comprises at least one electromagnet. Each magnet unit is connected to a source of electrical current, and so the magnetic flux from each magnet unit is separately controllable. In an embodiment, each of the electromagnets in the assembly comprises an electrically-conductive coil and a specially-shaped magnetic core. The core of the electromagnet is "dumbbell"-shaped, with a central portion and two end portions whose maximum diameter is larger than that of the central portion as described in US Patent Application Publication US2009/0145743, hereby incorporated by reference for its description of magnetron sputtering methods and apparatus. The coil is located around the central portion of the dumbbell. The magnetic flux generated by flow of current through the coil is transmitted to the two end portions of the dumbbell outside the coil. The electromagnets are spaced so that the magnetic cores are not in contact with each other. When the magnet assembly comprises electromagnets, at least one source of electrical current is used to produce flow of current through the electromagnets, thereby generating a magnetic field. In an embodiment, the source of electrical current is adjustable. In an embodiment, the source of electrical current is a low current power supply. As used herein, a low current power supply is capable of supplying current in a range of 1 to 50 amps. In an embodiment, the source of electrical current is a direct current (DC) power supply.

In an aspect, the workpiece is elongate. In an embodiment, the workpiece is in the form of a tube which is symmetric about its longitudinal axis. As used herein, a tube is an elongated hollow body which may or may not have a constant diameter along the length of the body. For example, a tube may be have an inner surface which is cylindrical, tapered, or has a shape similar to that formed by a bellow. The work piece may be open ended or closed at one end. Examples of non-cylindrical workpiece surfaces, include, but are not limited to, tapered surfaces or surfaces having cavities. A workpiece surface which is non-cylindrical as a whole can have one or more sections which are cylindrical. For example, a tube may have an inner surface with a cylindrical portion connected to a tapered portion.

In an embodiment, the workpiece is external to the sputtering target assembly and may be oriented vertically or horizontally. The distance between the cylindrical surface of the sputtering target and a non-cylindrical workpiece surface is generally not constant along the length of the workpiece. One way to improve the coating uniformity for such a surface is to adjust the strength of the magnetic field along the length of the emitter to compensate for differences in emitter-to-workpiece distance. For example, a stronger magnetic field can compensate for more distant workpiece surfaces. In general, the magnetic flux produced by the assembly is affected by the number of turns in each electromagnet coil, the current supplied to each coil, the polarity of each coil, the distance between the coils, and the core material. Each of these factors can be independently controlled to tailor the coating deposition to the workpiece surfaces.

As used herein, sputtering extends to all types of sputtering and combinations thereof, including DC or pulse (for example, AC) magnetron sputtering at a wide range of frequencies, including RF sputtering, which uses a radio frequency (RF) field in the reduced pressure chamber. As well, sputtering extends to reactive sputtering. In the coating methods of the invention, the plasma and magnetic field strengths are sufficient to form sputtering gas ions which are capable of sputtering the target materials. In general, the area of overlap between the magnetic field and the plasma field defines one or more coating zones where enhanced sputtering of the target occurs.

During sputter deposition, a low pressure environment is provided within a reduced pressure chamber. Typically the low pressure environment is external to the emitter and internal to the workpiece. As used herein, a low pressure environment has a pressure around or less than $10^{-3}$ torr. To produce the required pressure, the reduced pressure chamber is connected to a source of vacuum (not shown). The connection may be made through a discharge port. Any type of vacuum pump known in the art that is capable of attaining the required pressure may be used.

During sputter deposition, sputtering gas is also introduced into the reduced pressure chamber. The connection between the reduced pressure chamber and the source of sputtering gas can be made through a gas inlet. Suitable sputtering gases include inert gases such as argon.

During sputtering, a source of electrical power (not shown) is used to create a plasma field between the multi-component target and the workpiece. The target acts as the cathode. This source of electrical power used to create the plasma field may be a high voltage power source or any other suitable power source known to one skilled in the art of sputter deposition.

In an embodiment, the magnet assembly is moved longitudinally relative to the sputtering target assembly during sputtering to compensate for longitudinal variations in magnetic field strength.

In another embodiment, the workpiece is heated between 200° C. and 1200° C. It is known that the sputtered atoms emitted by target arrive at the workpiece with sufficient energy that surface impurities may be driven off and the sputtered atom may penetrate into the lattice of the workpiece to generate a diffusion-type coating. If the workpiece is at an elevated temperature, the sputtered molecules may be more efficient in penetrating the lattice, thereby creating a better bond between the workpiece and the coating layer. In an embodiment, convection-type heater is used to heat the workpiece.

In an embodiment, a tensioning force is applied to a heated workpiece. One problem that may occur when heating portions of an elongated workpiece is that the workpiece may warp as a result of uneven thermal expansion. Warping may be alleviated in part by orienting the workpiece vertically. Warping may be further alleviated by tensioning the workpiece. The tensioning force may be applied to support flanges affixed to both ends of the workpiece. For example, one support flange may be fixed and a load applied to the other support flange.

In an embodiment, the coating is applied on the interior of the workpiece. In this embodiment, the sputtering target structure is located in the interior of the workpiece. In an embodiment, the magnet assembly may be located inside the sputtering target structure, as described in US Patent Application Publication US2009/0145743 (Yumshtyk et al) and U.S. Pat. No. 4,407,713 (Zega) and U.S. Pat. No. 6,436,252 (Tzatzov et al._hereby incorporated by reference for their description of magnetron sputtering methods and apparatus. In another embodiment, the magnet assembly may be located exterior to the workpiece, with the workpiece serving at least in part as the vacuum chamber as described in U.S. Pat. No. 6,193,853 to Yumshtyk et al., hereby incorporated by reference for its description of magnetron sputtering methods and apparatus.

In another embodiment, the coating is applied on the exterior of the workpiece. In this embodiment, the sputtering target structure is located exterior to the workpiece. The magnet assembly may be located inside the sputtering target structure, with the magnet assembly, sputtering target structure and workpiece all being located inside a vacuum chamber as described in US Patent Application Publication US2009/0145743. The magnet assembly may also be located outside the sputtering target structure and exterior to the vacuum chamber, with both the sputtering target structure and the workpiece being located within the vacuum chamber. as described in U.S. Pat. No. 6,193,853 to Yumshtyk et al. Typically the workpiece is rotated around its longitudinal axis for coating uniformity.

The invention may be further understood by the following non-limiting examples.

EXAMPLE 1

Wires of Zr (Zirconium) and Mo (Molybdenum) were selected to apply a ZrMo alloy of a specified composition (approximately 45 at % Zr and 55 at % Mo). Each wire had a rectangular-like shape where a Zr wire had its height (H1) equal to 0.7 mm and its width (W1) equal to 1.1 mm. The Mo wire had its dimensions h2=0.7 mm and W2=0.75 mm. Both wires were then wound together (coiled) in an interlocking fashion onto a tubular target body with a diameter of 12.5 mm with each wire having approximately 200 turns on the target body. The width of contact of each wire with the target body was approximately 0.5 mm and the width of contact of the interlocked wires with each other was approximately 0.4 mm. The ZrMo target was then used for a sputtering deposition onto a mild steel tubular substrate utilizing magnet assembly positioned outside the workpiece.

Figure 3:
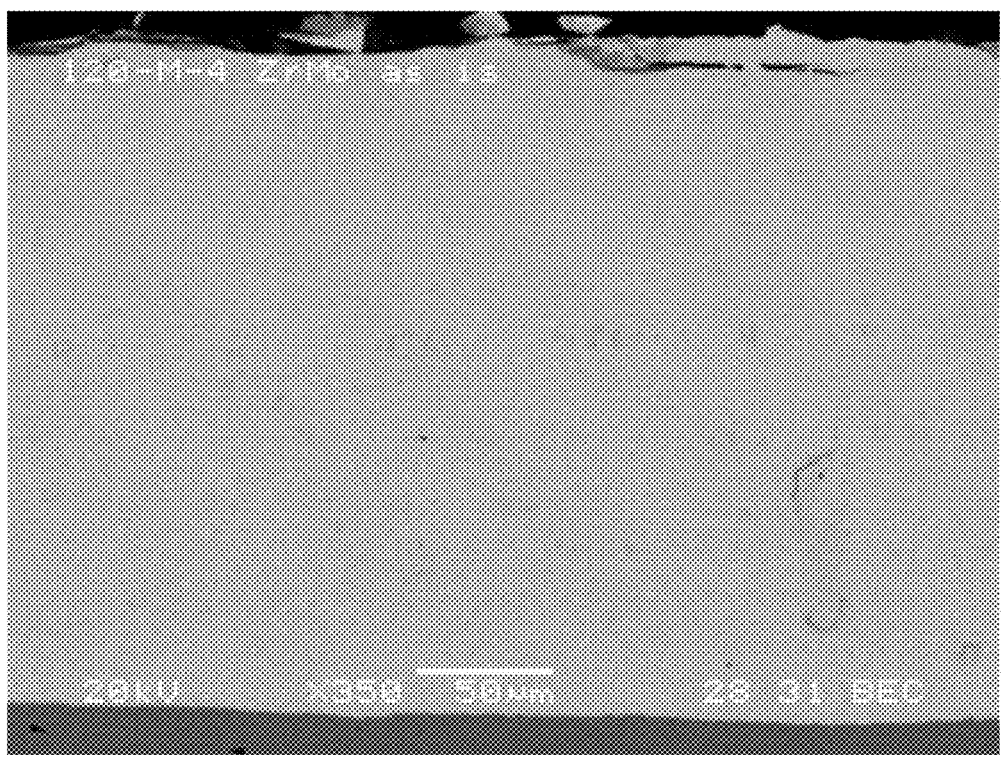
FIG. 3 is a back-scattered electron image of a zirconium molybdenum alloy.

The deposited coating was then analyzed using scanning electron microscopy and energy dispersive x-ray analysis. Back-scattered electron (BSE) images can be used to assess the homogeneity of the structure. FIG. 3 is a BSE image of a cross-section of the coating; the uniform contrast in the image indicates a homogeneous alloy structure. Energy dispersive x-ray analysis of the coating (area analysis) gives the following composition (Table 1):

TABLE 1

| Element | Wt % | At % |
|---------|-------|-------|
| Zr | 45.76 | 47.02 |
| Mo | 54.24 | 52.98 |
| Total | 100 | 100 |

EXAMPLE 2

Figure 4:
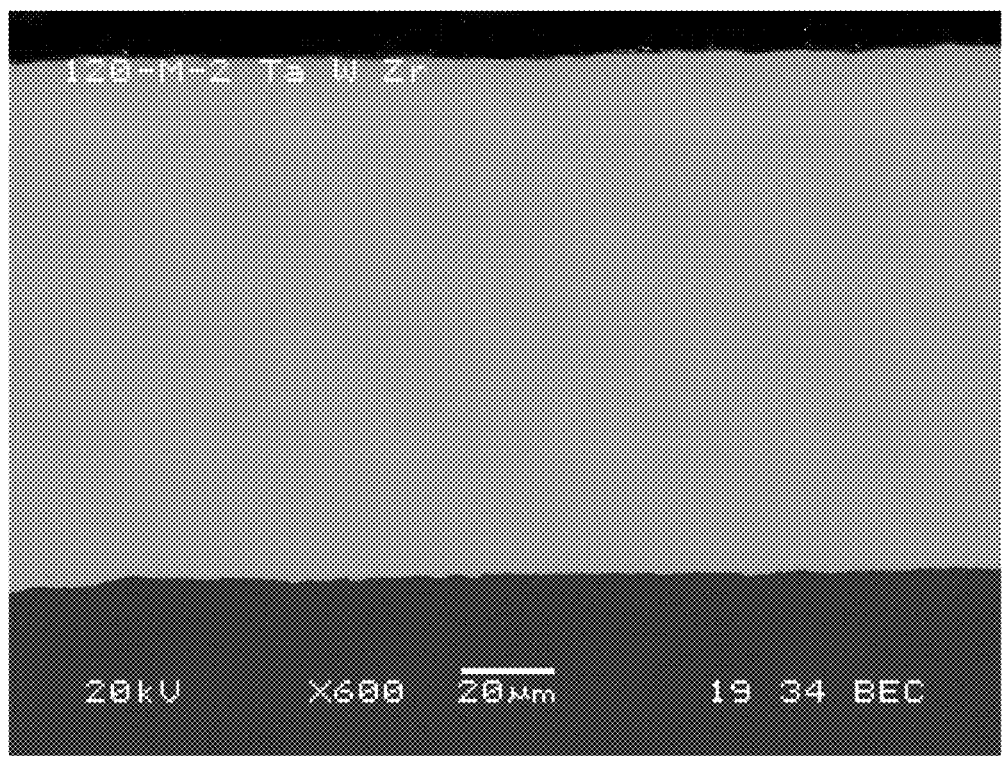
FIG. 4 is a back-scattered electron image of a zirconium molybdenum tungsten alloy.

Wires of Zr (Zirconium) and Ta (Tantalum) and W (Tungsten) were selected to apply a ZrTaW alloy of a specified composition (approximately 20 at % Zr 42 at % Ta and 38 at % W). Each wire had a rectangular-like shape where a Zr wire had its height (H1) equal to 1.2 mm and its width (W1) equal to 1.1 mm. The Ta wire had its dimensions H2=0.7 mm and W2=1.1 mm and W wire had dimensions H3=0.6 mm and W3=1.1 mm. The wires were then wound together (coiled) in an interlocking fashion onto a tubular target body with a diameter of 12.5 mm with each wire having approximately 200 turns on the target body. The width of contact of each wire with the target body was approximately 0.7 mm and the width of contact of the wires with each other was approximately 0.3 mm. The ZrTaW target was then used for a sputtering deposition onto a mild steel tubular substrate utilizing magnet assembly positioned within the inner bore of the sputtering target structure. The deposited coating was then analyzed using scanning electron microscopy and energy dispersive x-ray analysis. FIG. 4 is a BSE image of a cross-section of the coating; the uniform contrast in the image indicates a homogeneous alloy structure. Energy dispersive x-ray analysis of the coating (area analysis) gives the following composition (Table 2):

TABLE 2

| Element | At % | Wt % |
|---------|-------|-------|
| Ta | 37.52 | 31.53 |
| W | 42.47 | 35.11 |
| Zr | 20.01 | 33.36 |
| Total | 100 | 100 |

All references cited herein are hereby incorporated by reference to the extent not inconsistent with the disclosure herewith.

Although the description herein contains many specificities, these should not be construed as limiting the scope of the invention but as merely providing illustrations of some of the presently preferred embodiments of the invention. For example, thus the scope of the invention should be determined by the appended claims and their equivalents, rather than by the examples given.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those devices and methods consisting essentially of and consisting of the recited components or elements. The invention illustratively described herein suitably may be practiced in the absence of any element or elements, limitation or limitations which is not specifically disclosed herein.

Whenever a range is given in the specification, for example, a range of dimensions, or a range of an electrical parameter, all intermediate ranges and subranges, as well as all individual values included in the ranges given are intended to be included in the disclosure. When a Markush group or other grouping is used herein, all individual members of the group and all combinations and subcombinations possible of the group are intended to be individually included in the disclosure.

Patents and publications mentioned in the specification are indicative of the levels of skill of those skilled in the art to which the invention pertains. All references cited herein are hereby incorporated by reference to the extent that there is no inconsistency with the disclosure of this specification.

One skilled in the art would readily appreciate that the present invention is well adapted to carry out the objects and obtain the ends and advantages mentioned, as well as those inherent therein. The devices and methods and accessory methods described herein as presently representative of preferred embodiments are exemplary and are not intended as limitations on the scope of the invention. Changes therein and other uses will occur to those skilled in the art, which are encompassed within the spirit of the invention, are defined by the scope of the claims.

I claim:

1. A sputtering target structure comprising
   a) a tubular target support; and
   b) a multi-component target at least partially covering the outer surface of the target support, the multi-component target comprising
      i) a first component of a first material, the first component being coiled around the target support;
      ii) a second component of a second material, the second component being coiled around the target support;
   wherein the coils of the first and the second component are in contact with each other and the target support, adjacent loops of the coils contact each other and a region is formed comprising a plurality of adjacent loops of the first component and the second component, the region being 90-100% of the length of the longest coil;
   the cross-section of each of the first and the second component is other than circular, the first component is described by a first maximum height and a first maximum width, the second component is described by a second maximum width and a second maximum height and a first contact region is formed between the outer surface of the first component and the outer surface of the second component where the height of the first contact region is from 10% to 95% of the smaller of the maximum height of the first component and the maximum height of the second component; and the first contact region is formed by the plurality of adjacent loops of the first component and the second component in the region.

2. The sputtering target structure of claim 1, wherein the first and the second component are each in the form of a coiled wire.

3. The sputtering target structure of claim 1 wherein the maximum width of the first and the second component is from 0.20 to 3 mm.

4. The sputtering target structure of claim 1, wherein a second contact region is formed between the outer surface of the first component and the outer surface of the target support where the width of the first contact region is greater than or equal to 2% the average width of the first component.

5. The sputtering target structure of claim 1, wherein a third contact region is formed between the outer surface of the second component and the outer surface of the target support where the width of the second contact region is greater than or equal to 2% the average width of the second component.

6. The sputtering target structure of claim 1, wherein the ratio of the first maximum height to the second maximum height is from 0.3 to 3.

7. The sputtering target structure of claim 1, wherein the ratio of the first maximum width to the second maximum width is from 0.3 to 3.

8. The sputtering target structure of claim 1, wherein at least one of the first or the second material comprises a refractory metal.

9. The sputtering target structure of claim 1, wherein the first material is selected from the group consisting of Al, Ta, W, Cr, Mo, Ti, Nb, Hf, Zr, Co, Re, Si and Ni and alloys thereof.

10. The sputtering target structure of claim 1, wherein each of the coils of the first component and the second component has from 4 to 4 million loops.

11. The sputtering target structure of claim 1, wherein the multi-component target further comprises a third component of a third material, the third component being coiled around and in contact with the target support, being interlocking with the first and second component and being in contact with at least one of the first and second component.

12. The sputtering target structure of claim 1 wherein loops of the coil of the first component alternate with loops of the coil of the second component in the region.

13. The sputtering target structure of claim 11 wherein loops of the coil of the first component, the coil of the second component and the coil of the third component alternate in the region.

14. A method for applying a sputtered coating onto the interior surface of a hollow elongate workpiece, the method comprising the steps of:
  a) positioning a sputtering target structure within the workpiece so that the longitudinal axis of the sputtering target structure is parallel to the longitudinal axis of the workpiece and positioning a magnet assembly within the inner bore of the sputtering target structure or outside the workpiece, wherein the sputtering target structure comprises a tubular target support; and a multi-component target at least partially covering the outer surface of the target support, the multi-component target comprising
    i) a first component of a first material, the first component being coiled around the target support;
    ii) a second component of a second material, the second component being coiled around the target support;
    wherein the coils of the first and the second component are in contact with each other and the target support, adjacent loops of the coils contact each other and a region is formed comprising a plurality of adjacent loops of the first component and the second component, the region being 90-100% of the length of the longest coil;
    the cross-section of each of the first and the second component is other than circular, the first component is described by a first maximum height and a first maximum width, the second component is described by a second maximum width and a second maximum height and a first contact region is formed between the outer surface of the first component and the outer surface of the second component where the height of the first contact region is from 10% to 95% of the smaller of the maximum height of the first component and the maximum height of the second component; and the first contact region is formed by the plurality of adjacent loops of the first component and the second component in the region;
  b) providing a low pressure environment comprising a sputtering gas exterior to the sputtering target structure and interior to the workpiece;
  c) creating a plasma field between the sputtering target structure and the workpiece, thereby generating sputtering gas ions; and
  d) using the magnet assembly to create a magnetic field exterior to the sputtering target structure.

15. The method of claim 14 wherein the magnet assembly is located within the inner bore of the sputtering target structure.

16. The method of claim 14 wherein the magnet assembly is located outside the workpiece.

17. A method for applying a sputtered coating onto the exterior surface of a hollow elongate workpiece, the method comprising the steps of
  a) positioning a sputtering target structure so that the longitudinal axis of the sputtering target structure is parallel to the longitudinal axis of the workpiece and positioning a magnet assembly within the inner bore of the sputtering target structure or outside the workpiece, wherein the sputtering target structure comprises a tubular target support; and a multi-component target at least partially covering the outer surface of the target support, the multi-component target comprising
    i) a first component of a first material, the first component being coiled around the target support;
    ii) a second component of a second material, the second component being coiled around the target support;
    wherein the coils of the first and the second component are in contact with each other and the target support, adjacent loops of the coils contact each other and a region is formed comprising a plurality of adjacent loops of the first component and the second component, the region being 90-100% of the length of the longest coil;
    the cross-section of each of the first and the second component is other than circular, the first component is described by a first maximum height and a first maximum width, the second component is described by a second maximum width and a second maximum height and a first contact region is formed between the outer surface of the first component and the outer surface of the second component where the height of the first contact region is from 10% to 95% of the smaller of the maximum height of the first component and the maximum height of the second component; and the first contact region is formed by the plurality of adjacent loops of the first component and the second component in the region;

b) providing a low pressure environment containing a sputtering gas exterior to the sputtering target structure and exterior to the workpiece;

c) rotating the workpiece around its longitudinal axis;

d) creating a plasma field between the sputtering target structure and the workpiece, thereby generating sputtering gas ions; and e) using the magnet assembly to create a magnetic field exterior to the sputtering target structure.

18. The sputtering target structure of claim 1, wherein the first material is selected from the group consisting of Al, Cr, Ti, Hf, Co, Re, Si and Ni and alloys thereof.

* * * * *